US010991855B2

United States Patent
Chang et al.

(10) Patent No.: US 10,991,855 B2
(45) Date of Patent: Apr. 27, 2021

(54) WHITE LIGHT EMITTING DEVICE

(71) Applicant: Lextar Electronics Corporation, Hsinchu (TW)

(72) Inventors: Cheng-Ping Chang, Hsinchu (TW); Zong-Han Yu, Taoyuan (TW); Kuo-Chan Hung, Taipei (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 15/953,508

(22) Filed: Apr. 16, 2018

(65) Prior Publication Data

US 2019/0319175 A1 Oct. 17, 2019

(51) Int. Cl.
| | |
|---|---|
| *H01L 33/50* | (2010.01) |
| *H01L 33/56* | (2010.01) |
| *H01L 33/32* | (2010.01) |
| *H01L 33/54* | (2010.01) |
| *H01L 33/60* | (2010.01) |
| *H01L 33/48* | (2010.01) |

(52) U.S. Cl.
CPC .......... *H01L 33/504* (2013.01); *H01L 33/507* (2013.01); *H01L 33/32* (2013.01); *H01L 33/483* (2013.01); *H01L 33/54* (2013.01); *H01L 33/56* (2013.01); *H01L 33/60* (2013.01)

(58) Field of Classification Search
CPC ... H01L 33/504; H01L 33/507; H01L 33/483; H01L 33/32; H01L 33/60; H01L 33/54; H01L 33/56; C09K 11/7774; C09K 11/617; C09K 11/7731; C09K 11/7734; C09K 11/778
See application file for complete search history.

(56) References Cited

U.S. PATENT DOCUMENTS

| | | | |
|---|---|---|---|
| 6,084,250 A | 7/2000 | Justel et al. | |
| 8,408,726 B2 | 4/2013 | Harbers et al. | |
| 2011/0220929 A1* | 9/2011 | Collins | C09K 11/7734 257/98 |
| 2012/0267999 A1* | 10/2012 | Sakuta | C09K 11/7739 313/503 |
| 2015/0377429 A1* | 12/2015 | Yoo | C09K 11/7739 313/503 |

(Continued)

FOREIGN PATENT DOCUMENTS

| | | |
|---|---|---|
| KR | 101706600 B1 | 2/2017 |
| TW | 201116610 A | 5/2011 |

*Primary Examiner* — Kenneth Parker
*Assistant Examiner* — Long H Le
(74) *Attorney, Agent, or Firm* — CKC & Partners Co, LLC

(57) ABSTRACT

A white light emitting device includes a blue LED chip having a dominant emission wavelength of about 440-465 nm, and a phosphor layer configured to be excited by the dominant emission wavelength of the blue LED chip. The phosphor layer includes a first phosphor having a peak emission wavelength of about 480-519 nm, a second phosphor having a peak emission wavelength of about 520-560 nm, and a third phosphor having a peak emission wavelength of about 620-670 nm. The first phosphor and the second phosphor both have a garnet structure as represented by $A_3B_5O_{12}$:Ce, A is selected from the group consisting of Y, Lu, and a combination of thereof, and B is selected from the group consisting of Al, Ga, and a combination of thereof.

14 Claims, 10 Drawing Sheets

(56) References Cited

U.S. PATENT DOCUMENTS

| | | |
|---|---|---|
| 2016/0208164 A1 | 7/2016 | Katsumoto et al. |
| 2017/0309795 A1 | 10/2017 | Kim et al. |
| 2018/0108817 A1* | 4/2018 | Chang .................... H01L 25/13 |
| 2018/0226549 A1* | 8/2018 | Nakabayashi ...... H01L 25/0753 |
| 2018/0261733 A1* | 9/2018 | Miwa ................. H01S 5/02276 |

* cited by examiner

WHITE LIGHT EMITTING DEVICE

BACKGROUND

Field of Invention

The present invention relates to a light emitting device. More particularly, the present invention relates to a white light emitting device having high color rendering.

Description of Related Art

Along with the development of semiconductor technology, the white light emitting diode (LED) device has replaced traditional lighting devices in various fields. The conventional white LED device combines a blue LED chip and two phosphors with different emission wavelengths. More specifically, the blue LED chip emits blue light as an excitation light source, and then the phosphors are excited by the blue light to emit red light and green light. The white LED device can generate white light by mixing the blue light of blue LED, the red light and the green light.

However, the conventional white LED device has color rendering index (CRI) of approximately 80, which has difficulty in emitting white light close to a natural light. Since the requirements for high qualities of lighting devices have continuously increased, there is a need for a white light emitting device which can improve the above problems.

SUMMARY

The present invention provides a white light emitting device which may improve the color rendering index (CRI), the fidelity index (Rf), and the Color Gamut Index (Rg).

In accordance with an aspect of the present invention, a white light emitting device is provided. The white light emitting device includes a blue LED chip configured to emit a light having a dominant emission wavelength of about 440-465 nm, and a phosphor layer configured to be excited by the light having the dominant emission wavelength of the blue LED chip. The phosphor layer includes a first phosphor having a peak emission wavelength of about 480-519 nm, a second phosphor having a peak emission wavelength of about 520-560 nm, and a third phosphor having a peak emission wavelength of about 620-670 nm, wherein the first phosphor and the second phosphor both have a garnet structure represented by $A_3B_5O_{12}$:Ce, A is selected from the group consisting of Y, Lu, and a combination of thereof, and B is selected from the group consisting of Al, Ga, and a combination of thereof.

According to one embodiment of the present invention, the first phosphor includes $Lu_3Al_5O_{12}$:Ce, $Lu_3(Al,Ga)_5O_{12}$:Ce, $Y_3(Al,Ga)_5O_{12}$:Ce, $(Lu,Y)_3Al_5O_{12}$:Ce, $(Lu,Y)_3(Al,Ga)_5O_{12}$:Ce or a combination thereof.

According to one embodiment of the present invention, the second phosphor includes $Lu_3Al_5O_{12}$:Ce, $Lu_3(Al,Ga)_5O_{12}$:Ce, $Y_3(Al,Ga)_5O_{12}$:Ce, $(Lu,Y)_3Al_5O_{12}$:Ce, $(Lu,Y)_3(Al,Ga)_5O_{12}$:Ce or a combination thereof.

According to one embodiment of the present invention, third phosphor includes $CaAlSiN_3$:Eu, $Sr_2Si_5N_8$:Eu, $K_2SiF_6$:$Mn^{4+}$, $Sr(LiAl_3N_4)$:$Eu^{2+}$, or a combination thereof.

According to one embodiment of the present invention, a weight ratio of the first phosphor:the second phosphor:the third phosphor=(0.05-1):1 (0.05-0.25).

According to one embodiment of the present invention, the white light emitting device is configured to emit a light having a correlated color temperature (CCT) from 2700K to 3500K, and the weight of the third phosphor is substantially equal to or greater than the first phosphor.

According to one embodiment of the present invention, the white light emitting device is configured to emit a light having a correlated color temperature (CCT) from 3750K to 4250K, and the weight of the second phosphor is greater than the first phosphor, and the weight of the first phosphor is greater than the third phosphor.

According to one embodiment of the present invention, the white light emitting device is configured to emit a light having a correlated color temperature (CCT) from 5000K to 6500K, and the weight of the second phosphor is substantially equal to or greater than the first phosphor, and the weight of the first phosphor is greater than the third phosphor.

According to one embodiment of the present invention, the white light emitting device has a Color Fidelity Index (Rf) that is greater than 93.

According to one embodiment of the present invention, the white light emitting device has a Color Gamut Index (Rg) that ranges from 99 to 130.

According to one embodiment of the present invention, the white light emitting device has a color rendering index (CRI) that is greater than 95 at correlated color temperature (CCT) of 2700-6500K.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
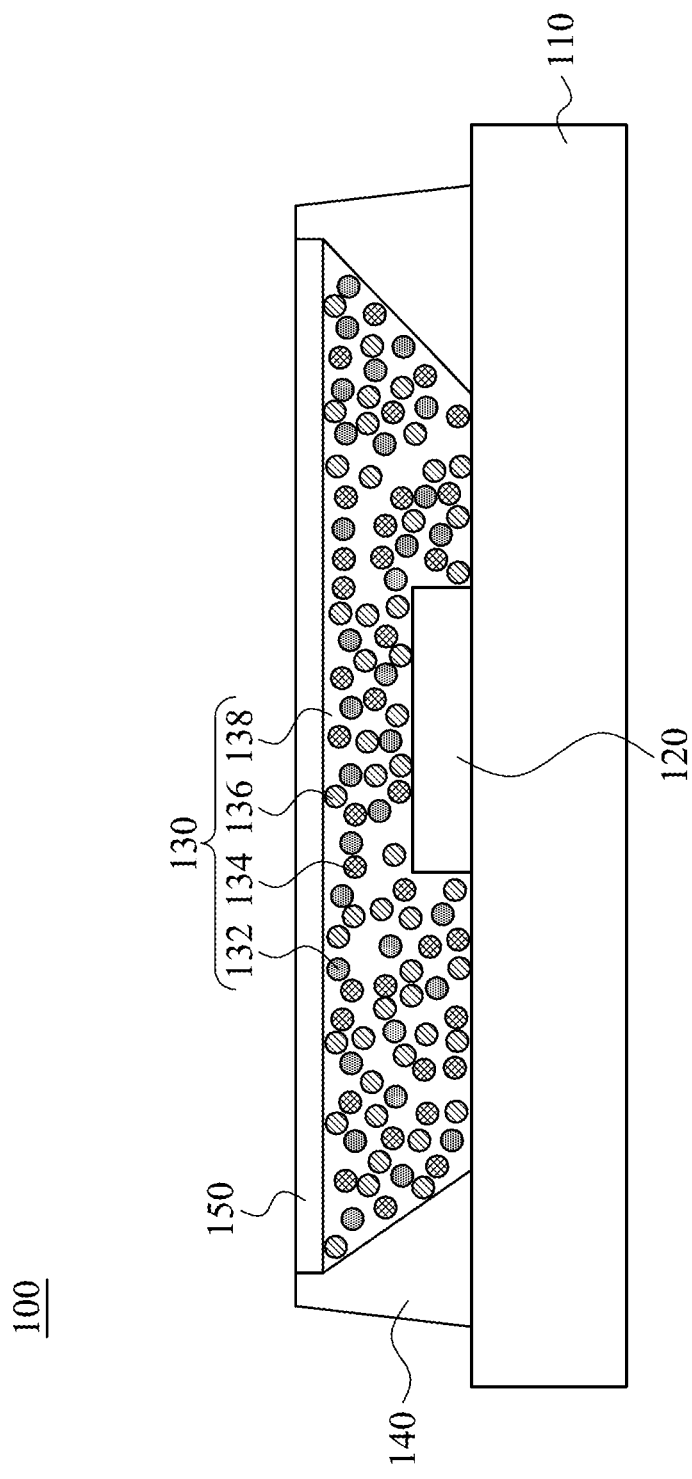
FIG. 1 is a cross-sectional view of a white light emitting device in accordance with various embodiments of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a white light emitting device 100 in accordance with various embodiments of the present invention. The white light emitting device 100 includes a blue LED chip 120 disposed on a substrate 110 and a phosphor layer 130 covering the blue LED chip 120. The white light emitting device 100 may optionally include other elements, which are described hereinafter.

The blue LED chip 120 is configured to emit blue light having a dominant emission wavelength of about 440-465 nm. The blue LED chip 120 may have a peak wavelength in the range of the dominant emission wavelength. The blue LED chip 120 may include any suitable light emitting diode structure and/or material known in the art such as, InGaN or GaN. In some embodiments, the blue LED chip 120 is electrically connected to the substrate 110. The substrate 110 may be, for example, a printed circuit board (PCB), a metal core PCB, a metal PCB (MPCB), a flexible PCB (FPCB), or any other suitable substrate. It should be understood that although the white light emitting device 100 in FIG. 1 depicts only one blue LED chip 120, this is merely an example, and the white light emitting device 100 may include a plurality of blue LED chips 120 as required.

The phosphor layer 130 covers the blue LED chip 120. The phosphor layer 130 includes a first phosphor 132, a second phosphor 134, and a third phosphor 136. The first, second, and third phosphor 132, 134, 136 are capable of being excited by the blue light with a wavelength of about 440-465 nm emitted from the blue LED chip 120. In some embodiments, the phosphor layer 130 further includes a sealant material 138, and the first, second, and third phosphor 132, 134, 136 are dispersed therein. In some examples, the sealant material 138 includes silicone, epoxy, polystyrene (PS), or the like.

The first, second, and third phosphor 132, 134, 136 have different emission wavelengths. Specifically, the first phosphor 132 includes blue-green phosphor which may emit light having a peak emission wavelength of about 480-519 nm when it is excited by the blue light emitted from the blue LED chip 120. Further, the second phosphor 134 includes green phosphor which may emit light having a peak emission wavelength of about 520-560 nm when it is excited by blue light emitted from the blue LED chip 120. In addition, the third phosphor 136 includes red phosphor which may emit light having a peak emission wavelength of about 620-670 nm when it is excited by blue light emitted from the blue LED chip 120.

The first phosphor 132 and the second phosphor 134 both have a garnet structure represented by $A_3B_5O_{12}$:Ce, in which A is selected from the group consisting of Y, Lu, and a combination of thereof, and B is selected from the group consisting of Al, Ga, and a combination of thereof. In some examples, the first phosphor 132 includes $Lu_3Al_5O_{12}$:Ce, $Lu_3(Al,Ga)_5O_{12}$:Ce, $Y_3(Al,Ga)_5O_{12}$:Ce, $(Lu,Y)_3Al_5O_{12}$:Ce, $(Lu,Y)_3(Al,Ga)_5O_{12}$:Ce or a combination thereof. In some embodiments, the second phosphor 134 includes $Lu_3Al_5O_{12}$:Ce, $Lu_3(Al,Ga)_5O_{12}$:Ce, $Y_3(Al,Ga)_5O_{12}$:Ce, $(Lu,Y)_3Al_5O_{12}$:Ce, $(Lu,Y)_3(Al,Ga)_5O_{12}$:Ce or a combination thereof.

In some embodiments, except that the doping concentrations of Ce are different, the first phosphor 132 and the second phosphor 134 may be the same type of phosphor. When the doping concentration of Ce in the garnet structure increases, the emission wavelength of the phosphor may shift toward longer emission wavelength. In such case, the doping concentration of Ce of the second phosphor 134 may be greater than the first phosphor 132. For example, the first phosphor 132 may be $(Lu_{1-a1})_3Al_5O_{12}$:$Ce_{a1}$ having a peak emission wavelength of about 480-519 nm, the second phosphor 134 may be $(Lu_{1-a2})_3Al_5O_{12}$:$Ce_{a2}$ having a peak emission wavelength of about 520-560 nm, in which 0<a1<1, 0<a2<1, and a2 is greater than a1. For example, a1 may be 0.1, 0.2, 0.3, 0.4, 0.5, 0.6, 0.7, 0.8, or 0.9, a2 may be 0.1, 0.2, 0.3, 0.4, 0.5, 0.6, 0.7, 0.8, or 0.9, and a2 is greater than a1.

In some embodiments, except that the molar ratios of the composition (Al, Ga) are different, the first phosphor 132 and the second phosphor 134 may be the same phosphor represented by $A_3(Al,Ga)_5O_{12}$:Ce, in which A is selected from the group consisting of Y, Lu, and a combination of thereof. When a part of Al is substituted with Ga among the composition $A_3(Al,Ga)_5O_{12}$:Ce, the emission wavelength of the phosphor may shift toward shorter emission wavelength. That is, in such case, the amount of Ga of the first phosphor 132 may be greater than the second phosphor 134. For example, the first phosphor 132 may be $Lu_3(Al_{1-b1}Ga_{b1})_5O_{12}$:Ce having a peak emission wavelength of about 480-519 nm, the second phosphor 134 may be $Lu_3(Al_{1-b2}Ga_{b2})_5O_{12}$:Ce having a peak emission wavelength of about 520-560 nm, in which 0<b1<1, 0<b2<1, and b1 is greater than b2. For example, b1 may be 0.1, 0.2, 0.3, 0.4, 0.5, 0.6, 0.7, 0.8, or 0.9, b2 may be 0.1, 0.2, 0.3, 0.4, 0.5, 0.6, 0.7, 0.8, or 0.9, and b1 is greater than b2.

In other embodiments, except that the molar ratios of the composition of (Lu, Y) are different, the first phosphor 132 and the second phosphor 134 may be the same phosphor represented by $(Lu,Y)_3B_5O_{12}$:Ce, in which B is selected from the group consisting of Al, Ga, and a combination of thereof. When a part of Y is substituted with Lu among the $(Lu,Y)_3B_5O_{12}$:Ce, the emission wavelength of the phosphor may shift toward shorter emission wavelength. That is, in such case, the amount of Lu of the first phosphor 132 may be greater than the second phosphor 134. For example, the first phosphor 132 may be $(Lu_{1-c1}Y_{c1})_3Al_5O_{12}$:Ce having a peak emission wavelength of about 480-519 nm, the second phosphor 134 may be $(Lu_{1-c2}Y_{c2})_3Al_5O_{12}$:Ce having a peak emission wavelength of about 520-560 nm, in which 0<c1<1, 0<c2<1, and c2 is greater than c1. For example, c1 may be 0.1, 0.2, 0.3, 0.4, 0.5, 0.6, 0.7, 0.8, or 0.9, c2 may be 0.1, 0.2, 0.3, 0.4, 0.5, 0.6, 0.7, 0.8, or 0.9, and c2 is greater than c1.

In still other embodiments, the first phosphor 132 may be $(Lu_{1-e1}Y_{e1})_3(Al_{1-f1}Ga_{f1})_5O_{12}$:Ce, and the second phosphor 134 may be $(Lu_{1-e2}Y_{e2})_3(Al_{1-f2}Ga_{f2})_5O_{12}$:Ce, in which 0<e1<1, 0<f1<1, 0<e2<1, 0<f2<1, e1 may be 0.1, 0.2, 0.3, 0.4, 0.5, 0.6, 0.7, 0.8, or 0.9, f1 may be 0.1, 0.2, 0.3, 0.4, 0.5, 0.6, 0.7, 0.8, or 0.9, e2 may be 0.1, 0.2, 0.3, 0.4, 0.5, 0.6, 0.7, 0.8, or 0.9, f2 may be 0.1, 0.2, 0.3, 0.4, 0.5, 0.6, 0.7, 0.8, or 0.9. In such case, e2 is greater than e1, and f1 is greater than f2.

In some embodiments, the third phosphor 136 comprise red phosphor which includes $CaAlSiN_3$:Eu, $Sr_2Si_5N_8$:Eu, $K_2SiF_6$:$Mn^{4+}$, $Sr(LiAl_3N_4)$:$Eu^{2+}$, or a combination thereof.

In some embodiments, a weight ratio of the first phosphor 132:the second phosphor 134:the third phosphor 136 is (0.05-1):1:(0.05-0.25). In some embodiments, the white light emitting device 100 is configured to emit a light having a correlated color temperature (CCT) from 2700K to 3500K, and the weight ratio of the third phosphor 136 is substantially equal to or greater than that of the first phosphor 132. In other embodiments, the white light emitting device 100 is configured to emit a light having a correlated color temperature (CCT) from 3750K to 4250K, and the weight ratio of the second phosphor 134 is greater than that of the first phosphor 132, and the weight ratio of the first phosphor 132 is greater than that of the third phosphor 136. In still other embodiments, the white light emitting device 100 is configured to emit a light having a correlated color temperature (CCT) from 5000K to 6500K, and the weight ratio of the second phosphor 134 is substantially equal to or greater than that of the first phosphor 132, and the weight ratio of the first phosphor 132 is greater than that of the third phosphor 136.

Still referring to FIG. 1, according to some embodiments, the white light emitting device 100 further includes a reflective wall 140 disposed on the substrate 110. The reflective wall 140 surrounds the blue LED chip 120 and reflects the light emitted from the blue chip 120, the first, second, and third phosphor 132, 134, 136. In some examples, the reflective wall 140 may be made of any suitable material such as, metal, ceramics, plastic including PCT, Epoxy Molding Compound (EMC), or the like. The phosphor layer 130 is formed within the reflective wall 140.

Still referring to FIG. 1, in some embodiments, a cover layer 150 is disposed on the phosphor layer 130. The blue LED chip 120 and the phosphor layer 130 are enclosed by the substrate 110, the reflective wall 140, and the cover layer 150. The cover layer 150 may be any suitable transparent material including glass, silicone, or the like.

From the above descriptions, the white light emitting device can generate white light by exciting the first phosphor, the second phosphor, and the third phosphor by blue light from the blue LED chip. Compared with the conventional white light emitting device, the white light emitting device disclosed herein uses the first phosphor having a peak emission wavelength of about 480-519 nm, the second phosphor having a peak emission wavelength of about 520-560 nm, and the third phosphor having a peak emission wavelength of about 620-670 nm. The white light emitting device in the present invention has great color rendering properties, and emits high quality white light with high color rendering index. That is, white light emitted from the white light emitting device disclosed herein may be close to the natural light, and can exhibit true color of the object being illuminated. In some embodiments, the white light emitting device has a color rendering index (CRI) that is greater than 95 at correlated color temperature (CCT) of 2700-6500K. In some embodiments, the white light emitting device 100 has a Color Fidelity Index (Rf) that is greater than 93. In some embodiments, the white light emitting device 100 has a Color Gamut Index (Rg) that ranges from 99 to 130.

The following Examples are provided to illustrate certain aspects of the present invention and to aid those of skilled in the art in practicing this disclosure. These Examples are in no way to be considered to limit the scope of the invention in any manner.

Example 1: White Light Emitting Device Having a Correlated Color Temperature (CCT) of about 2700K The white light emitting device include a blue LED chip having a dominant emission wavelength of about 440-465 nm, a plurality of $Lu_3(Al,Ga)_5O_{12}$:Ce particles as the first phosphor, a plurality of $Lu_3Al_5O_{12}$:Ce particles as the second phosphor, and a plurality of $CaAlSiN_3$:Eu particles as the third phosphor. The first phosphor is about 12 parts by weight, the second phosphor is about 100 parts by weight, and the third phosphor is about 16 parts by weight.

Figure 2A:
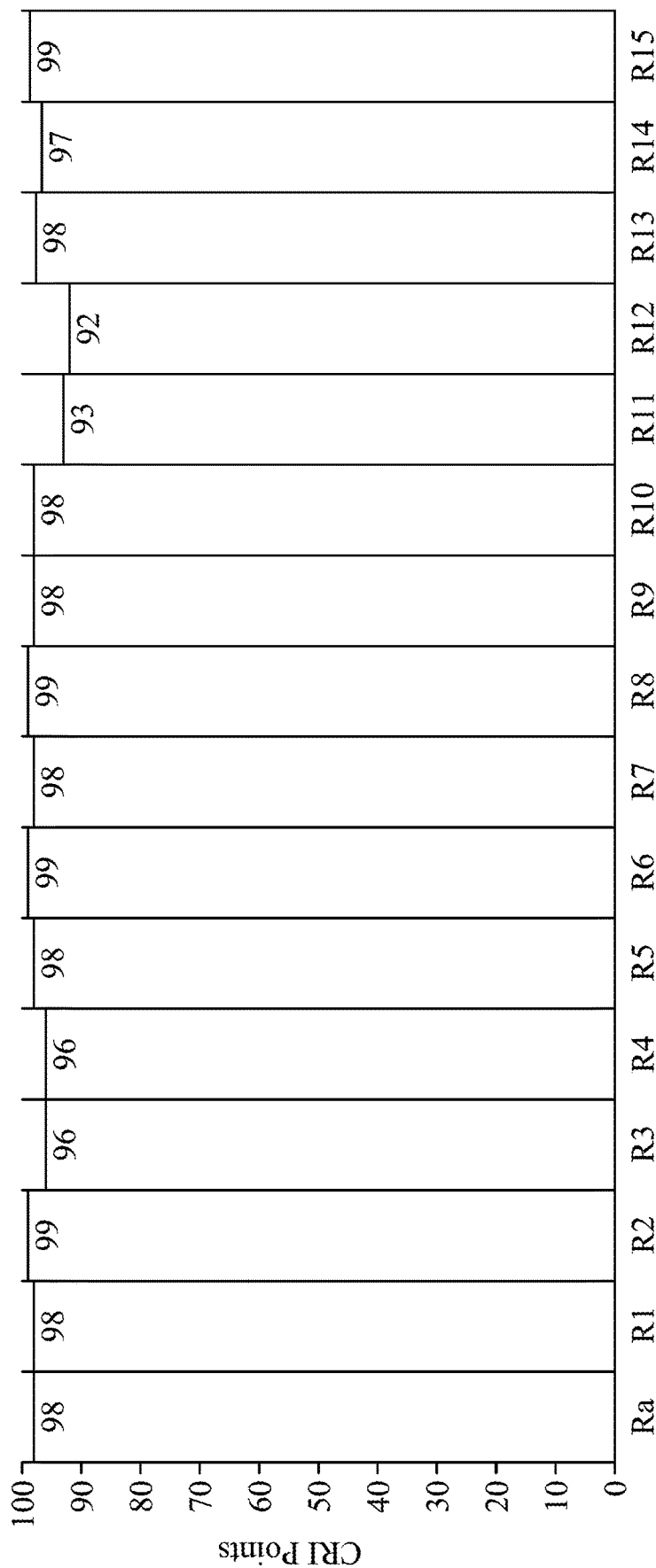
FIG. 2A is a bar graph of color rendering index (CRI) of a white light emitting device in accordance one embodiment of the present invention.

FIG. 2A is a bar graph of color rendering index (CRI) of a white light emitting device in accordance with Example 1. As shown in FIG. 2A, the light emitting device has a general color rendering index (Ra) of 98, R9 (saturated reds) of 98, and R12 (saturated blues) of 92.

Figure 2B:
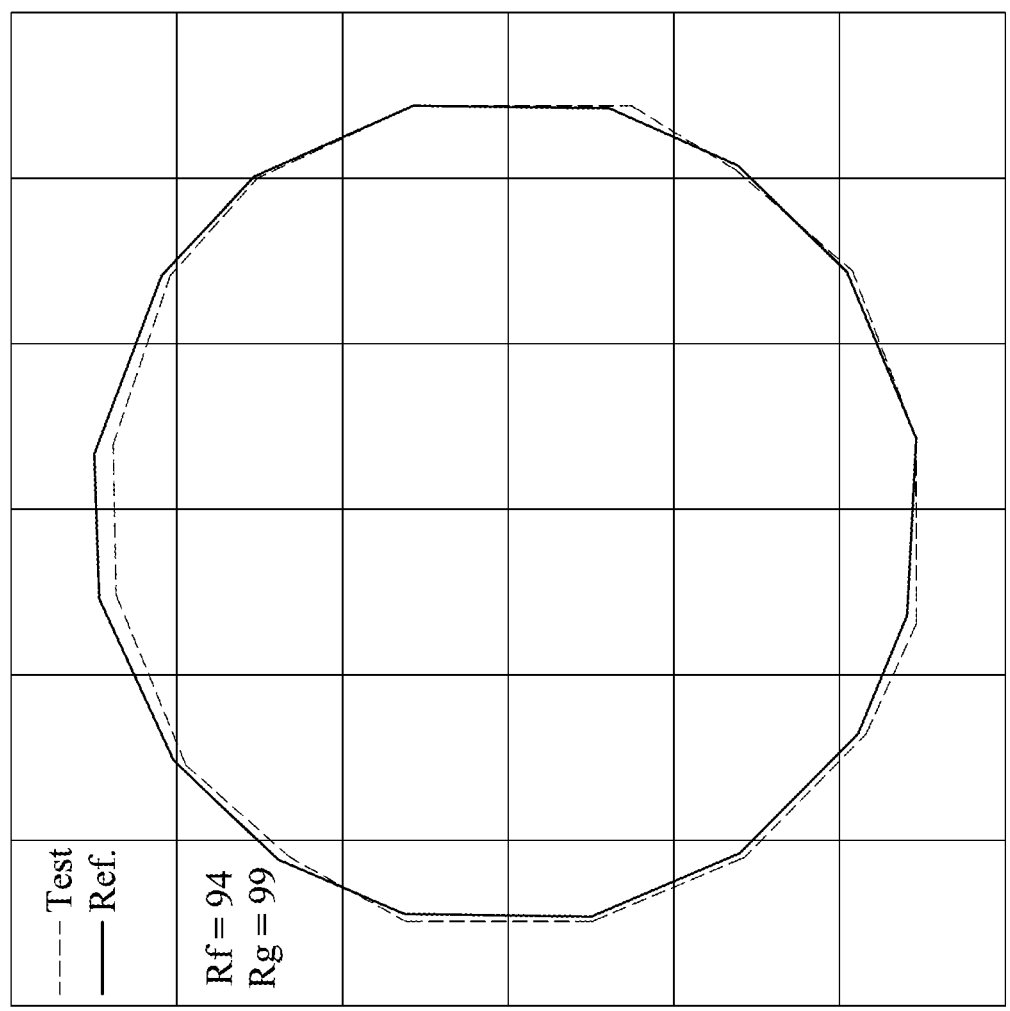
FIG. 2B is a color vector graphic of a white light emitting device in accordance with one embodiment of the present invention.
Figure 2C:
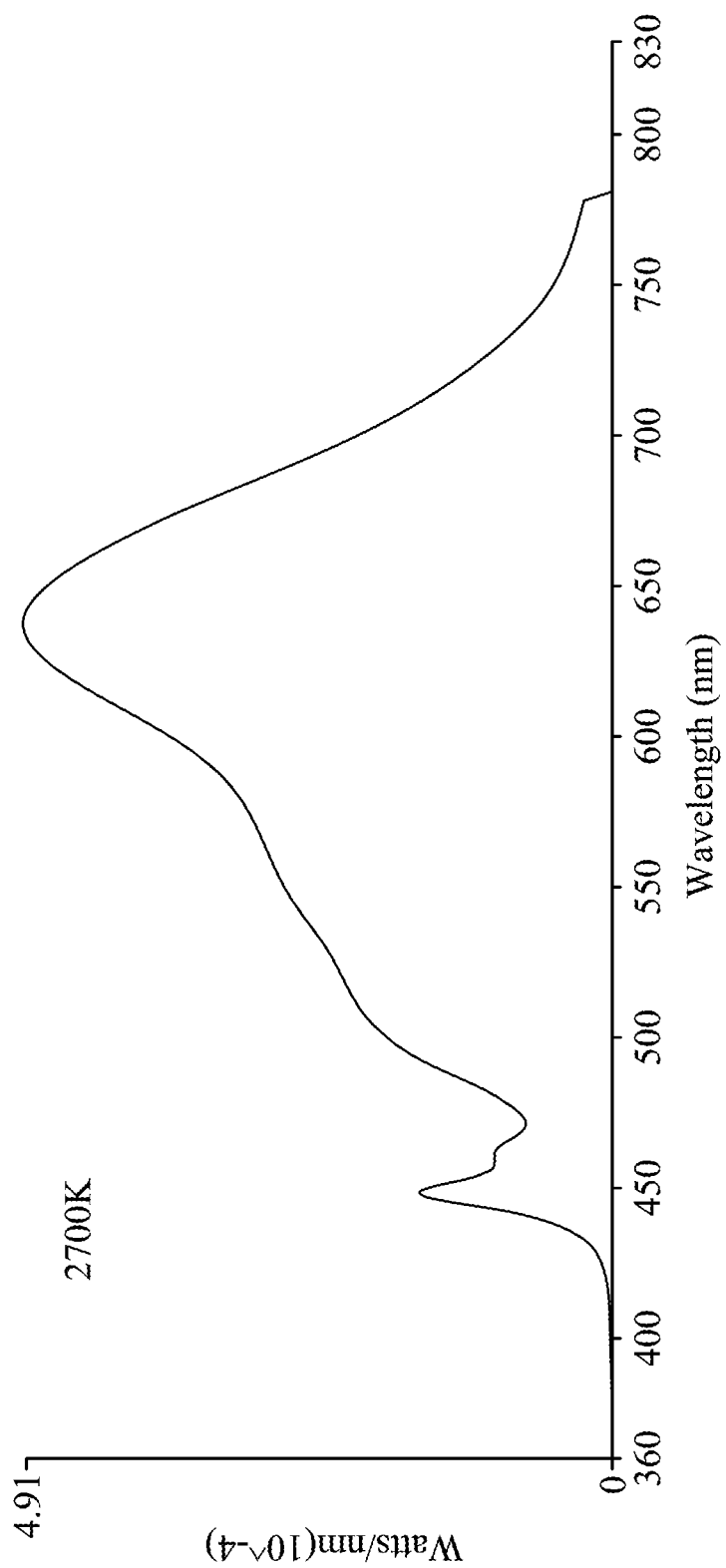
FIG. 2C is a schematic diagram of the emission spectrum band of a white light source device in accordance with one embodiment of the present invention.

FIG. 2B is a color vector graphic of a white light emitting device in accordance with Example 1. As shown in FIG. 2B, the light emitting device has a Color Fidelity Index (Rf) of 94 and a Color Gamut Index (Rg) of 99. The emission spectrum is shown in FIG. 2C.

Example 2: White Light Emitting Device Having a Correlated Color Temperature (CCT) of about 4000K The white light emitting device include a blue LED chip having a dominant emission wavelength of about 440-465 nm, a plurality of $Lu_3(Al,Ga)_5O_{12}$:Ce particles as the first phosphor, a plurality of $Lu_3Al_5O_{12}$:Ce particles as the second phosphor and a plurality of $CaAlSiN_3$:Eu particles as the third phosphor. The first phosphor is about 80 parts by weight, the second phosphor is about 100 parts by weight, and the third phosphor is about 14 parts by weight.

Figure 3A:
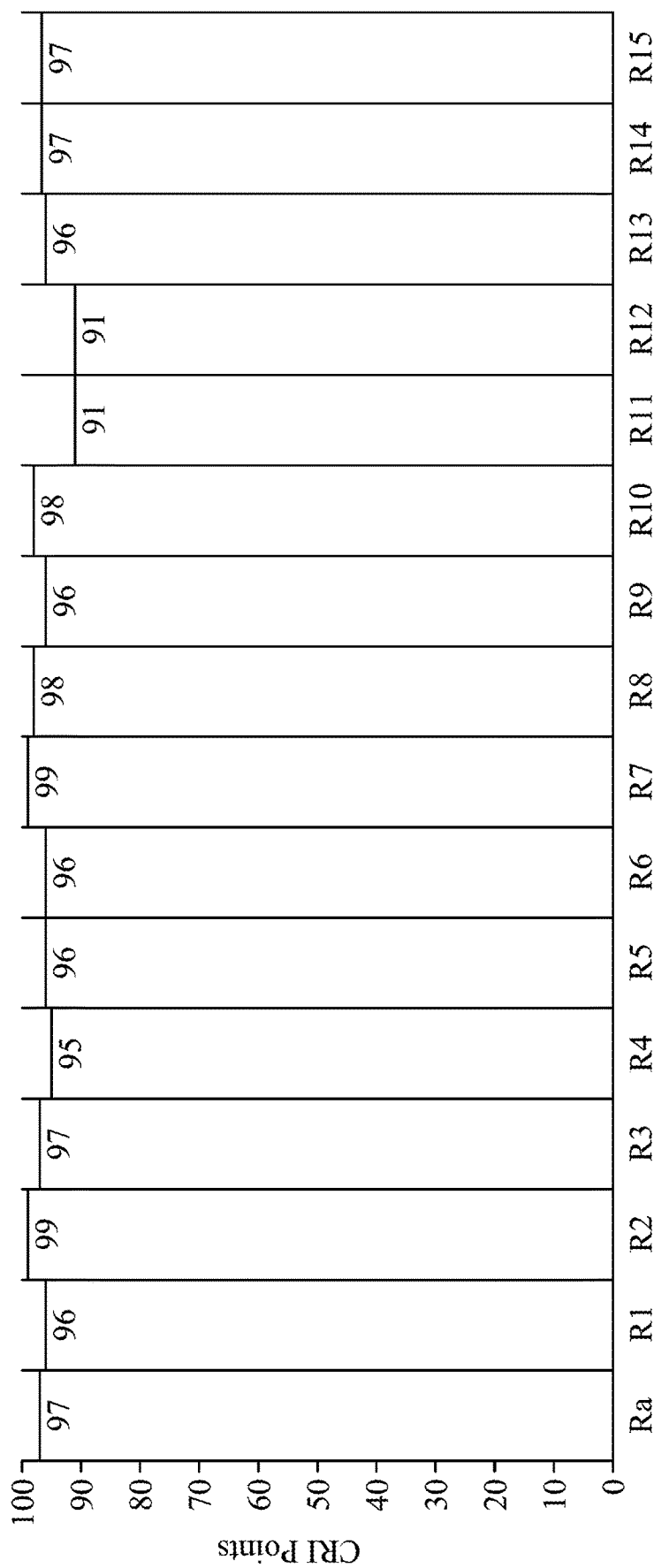
FIG. 3A is a bar graph of color rendering index (CRI) of a white light emitting device in accordance one embodiment of the present invention.

FIG. 3A is a bar graph of color rendering index (CRI) of a white light emitting device in accordance one embodiment of the present invention. As shown in FIG. 3A, the light emitting device has a general color rendering index (Ra) of 97, R9 (saturated reds) of 96, and R12 (saturated blues) of 91.

Figure 3B:
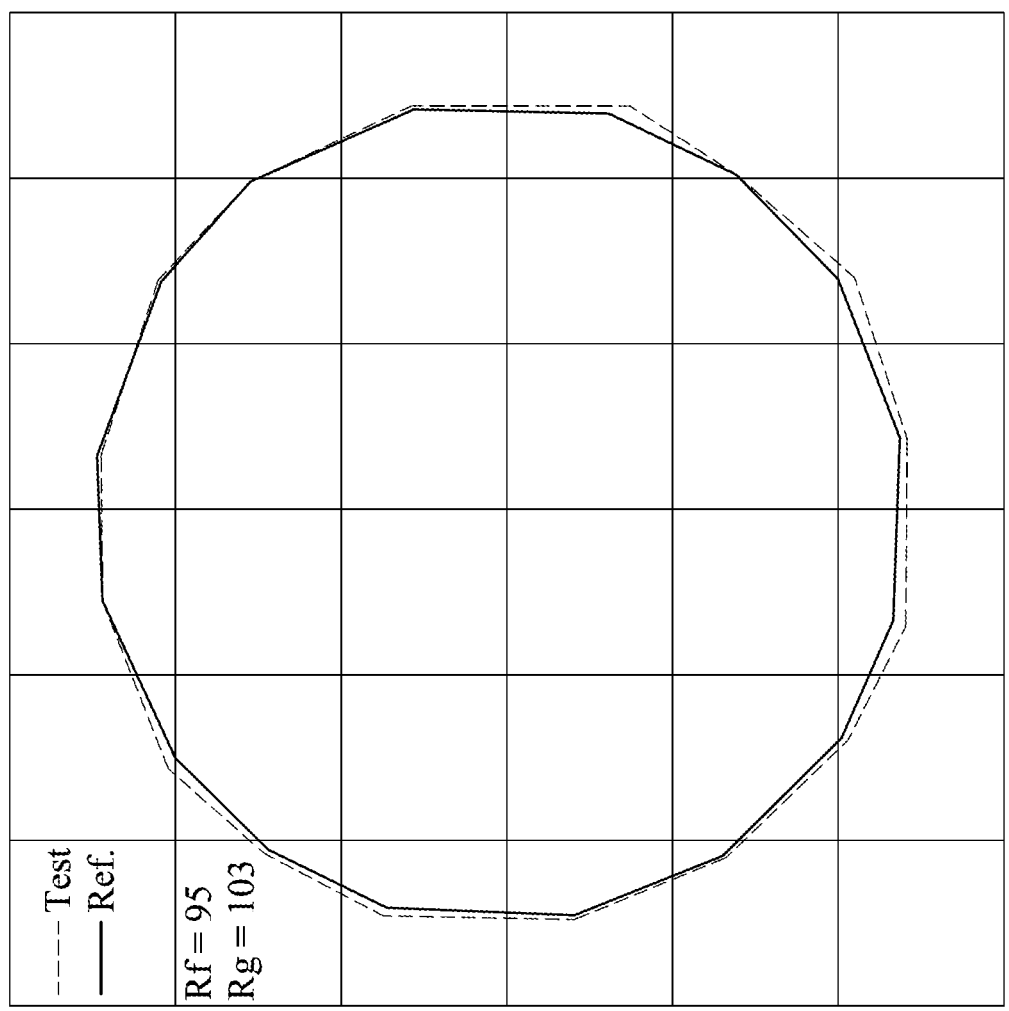
FIG. 3B is a color vector graphic of a white light emitting device in accordance with one embodiment of the present invention.
Figure 3C:
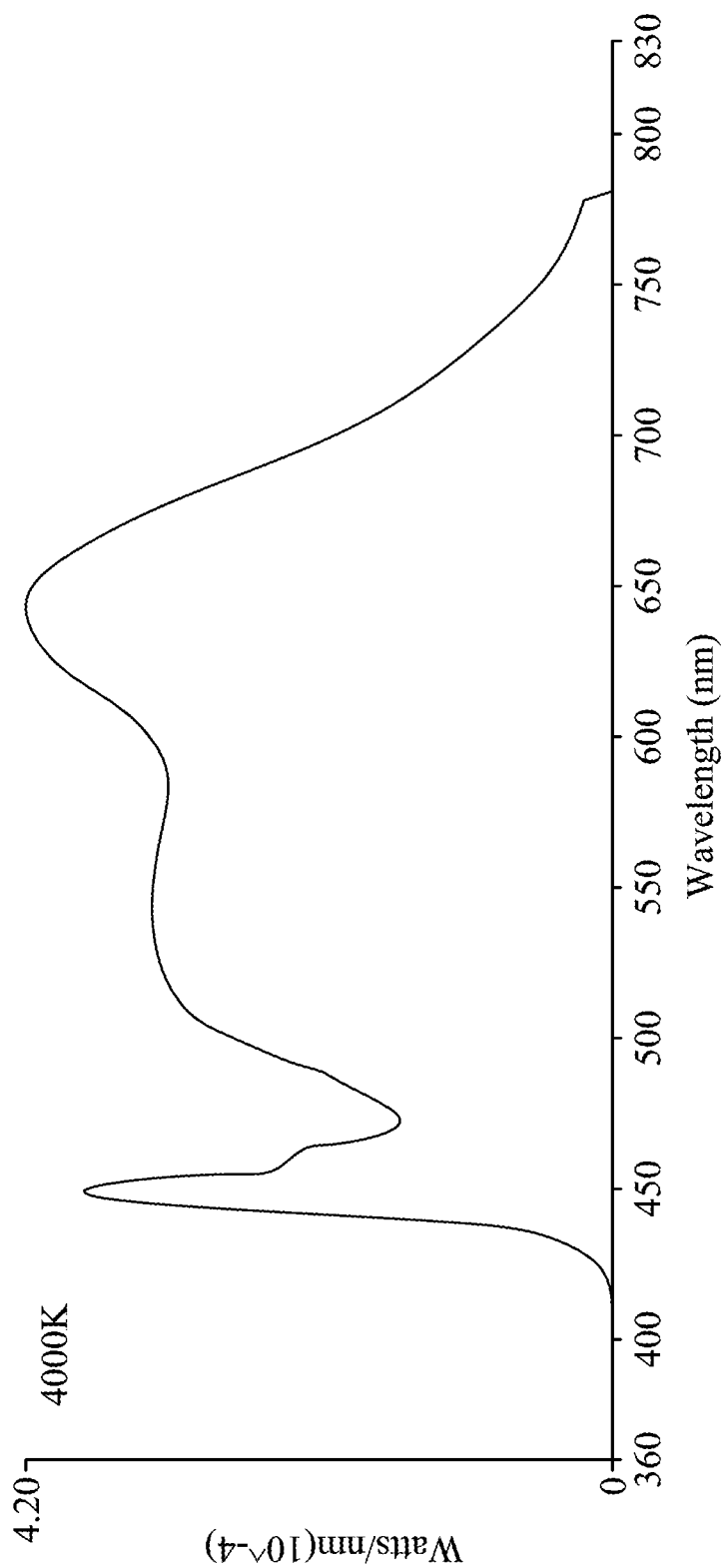
FIG. 3C is a schematic diagram of the emission spectrum band of a white light source device in accordance with one embodiment of the present invention.

FIG. 3B is a color vector graphic of a white light emitting device in accordance with one embodiment of the present invention. As shown in FIG. 3B, the light emitting device has a Color Fidelity Index (Rf) of 95, and a Color Gamut Index (Rg) of 103. The emission spectrum is shown in FIG. 3C.

Example 3: White Light Emitting Device Having a Correlated Color Temperature (CCT) of about 6500K The white light emitting device include a blue LED chip having a dominant emission wavelength of about 440-465 nm, a plurality of $Lu_3(Al,Ga)_5O_{12}$:Ce particles as the first phosphor, a plurality of $Lu_3Al_5O_{12}$:Ce particles as the second phosphor, and a plurality of $CaAlSiN_3$:Eu particles as the third phosphor. The first phosphor is about 100 parts by weight, the second phosphor is about 100 parts by weight, and the third phosphor is about 12 parts by weight.

Figure 4A:
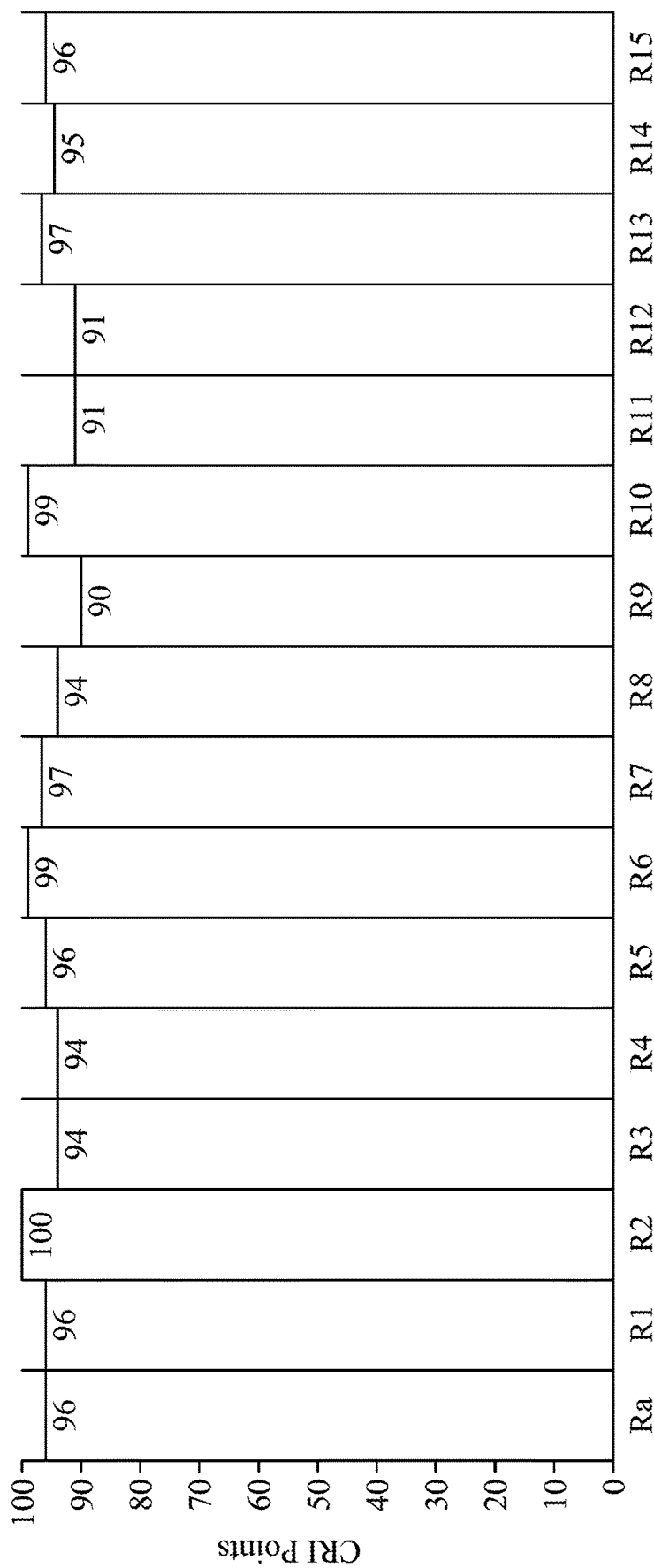
FIG. 4A is a bar graph of color rendering index (CRI) of a white light emitting device in accordance one embodiment of the present invention.

FIG. 4A is a bar graph of color rendering index (CRI) of a white light emitting device in accordance one embodiment of the present invention. As shown in FIG. 4A, the light emitting device has a general color rendering index (Ra) of 96, R9 (saturated reds) of 90, and R12 (saturated blues) of 91.

Figure 4B:
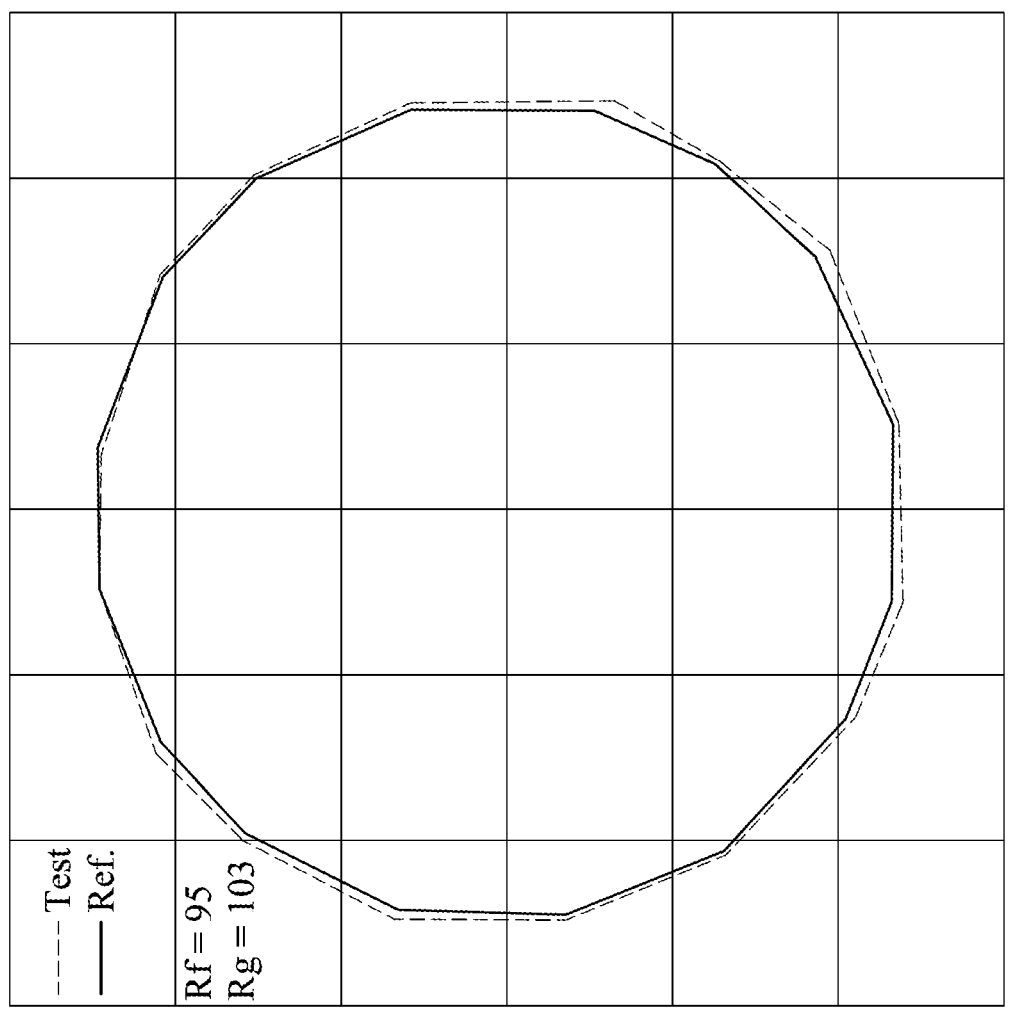
FIG. 4B is a color vector graphic of a white light emitting device in accordance with one embodiment of the present invention.
Figure 4C:
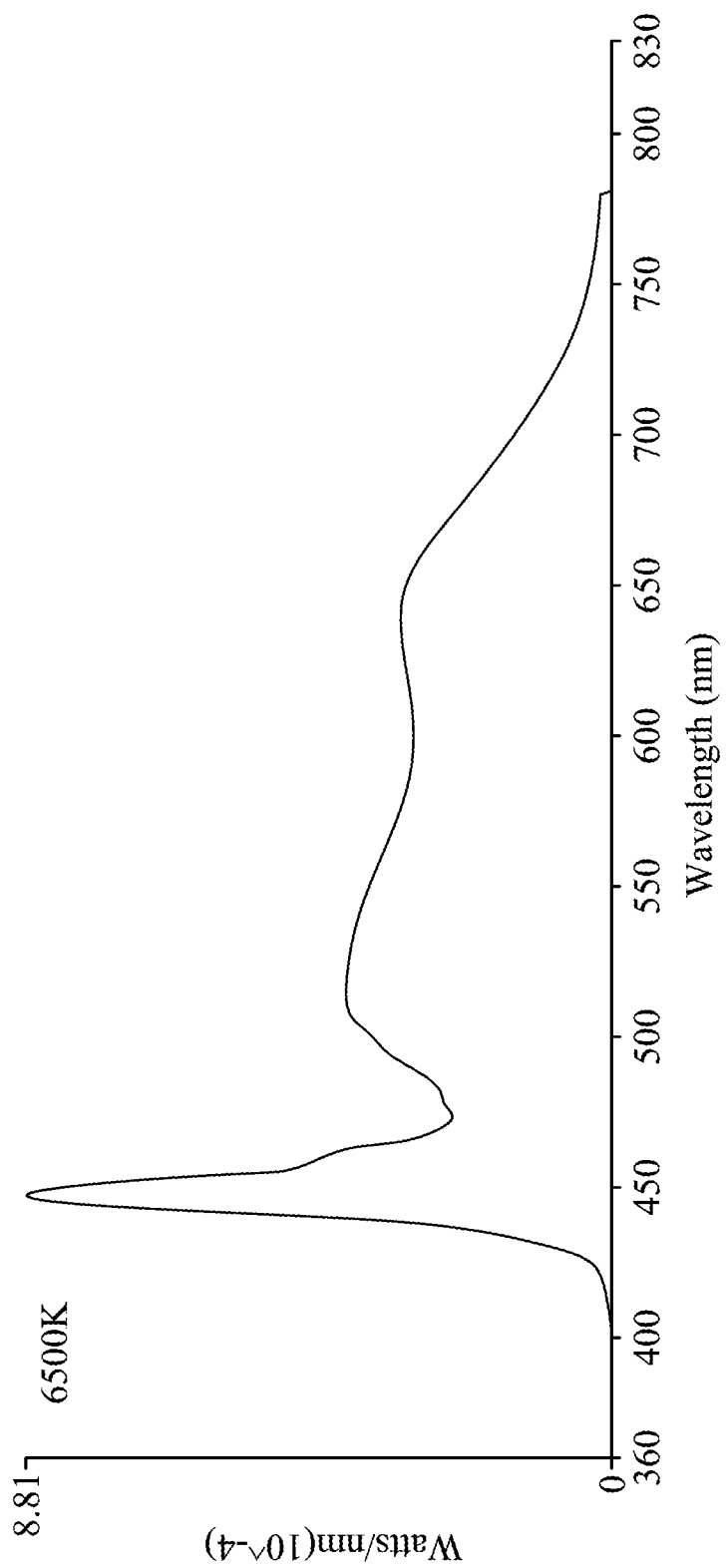
FIG. 4C is a schematic diagram of the emission spectrum band of a white light source device in accordance with one embodiment of the present invention.

FIG. 4B is a color vector graphic of a white light emitting device in accordance with one embodiment of the present invention. As shown in FIG. 4B, the light emitting device has a Color Fidelity Index (Rf) of 95, and a Color Gamut Index (Rg) of 103. The emission spectrum is shown in FIG. 4C.

Comparative Example 1: White Light Emitting Device

The white light emitting device includes a blue LED chip having a dominant emission wavelength of about 452-455 nm and only two types of phosphor, wherein the first type phosphor is green phosphor and the second phosphor is red phosphor. In Comparative Example 1, a plurality of LuAG particles are as the first phosphor, and a plurality of CaAlSiN$_3$ particles are as the second phosphor. The first phosphor is about 90 parts by weight, and the second phosphor is about 10 parts by weight.

Comparative Example 2: White Light Emitting Device

The white light emitting device includes a blue LED chip having a dominant emission wavelength of about 452-455 nm and only two types of phosphor, wherein the first type phosphor is green phosphor and the second phosphor is red phosphor. In Comparative Example 2, a plurality of LuAG particles as the first phosphor, and a plurality of CaAlSiN$_3$ particles as the second phosphor. The first phosphor is about 88 parts by weight, and the second phosphor is about 13 parts by weight.

The comparison of color rendering index (CRI), R9, R12, Color Fidelity Index (Rf), and Color Gamut Index (Rg) of above light emitting device are shown in Table 1.

TABLE 1

|  | CRI | R9 | R12 | Rf | Rg |
| --- | --- | --- | --- | --- | --- |
| Example 1 | 98 | 98 | 92 | 94 | 99 |
| Example 2 | 97 | 96 | 91 | 95 | 103 |
| Example 3 | 96 | 90 | 91 | 95 | 103 |
| Comparative Example 1 | 80 | 6 | 70 | 82 | 97 |
| Comparative Example 2 | 90 | 50 | 76 | 87 | 94 |

Referring to Table 1, it can be seen that the light emitting devices with three types of phosphor of this invention (Example 1-3) have a CRI of 96 or higher, a R9 value of 90 or higher, a R12 value of 91 or higher, a Rf value of 94 or higher, and a Rg value of 99 or higher. However, the light emitting device of Comparative Example 1 including only two types of phosphor shows a CRI of 80, which is much lower than the light emitting device of the present invention. Further, the light emitting device from Comparative Examples 1 and 2 both exhibit poor R9, R12, Rf, and Rg value, which are much lower than the light emitting device of the present invention. It is clearly that the light emitting devices of the present invention have better color rendering properties.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A white light emitting device for emitting a white light close to a natural light, comprising:
   a blue LED chip configured to emit a light having a dominant emission wavelength of about 440-465 nm;
   a phosphor layer configured to be excited by the light having the dominant emission wavelength of the blue LED chip, the phosphor layer comprising:
      a blue-green phosphor having a peak emission wavelength of about 480-519 nm;
      a green phosphor having a peak emission wavelength of about 520-560 nm; and
      a red phosphor having a peak emission wavelength of about 620-670 nm,
      wherein the blue-green phosphor and the green phosphor both have a garnet structure represented by A$_3$B$_5$O$_{12}$:Ce, A is selected from the group consisting of Y, Lu, and a combination of thereof, and B is selected from the group consisting of Al, Ga and a combination of thereof,
   a substrate having an upper surface, wherein the blue LED chip is disposed on the upper surface of the substrate;
   a transparent cover layer disposed on the phosphor layer, wherein the cover layer has a top surface, a bottom surface, and a side surface between the top and bottom surfaces; and
   a reflective wall disposed on the upper surface of the substrate, wherein the reflective wall reflects the light emitted from the blue LED chip and light emitted by the phosphor layer;
   wherein the reflective wall has an inner surface with an inclined portion which is inclined to the upper surface of the substrate, and a straight portion which is substantially vertical to the upper surface of the substrate;
   wherein the inclined portion of the inner surface of the reflective wall surrounds and directly contacts the phosphor layer, and surrounds the blue LED chip while being spaced apart from the blue LED chip; and
   wherein the straight portion of the inner surface of the reflective wall surrounds and directly contacts the side surface of the cover layer,
   wherein the white light emitting device has a Color Fidelity Index (Rf) that is greater than 93, a Color Gamut Index (Rg) that ranges from 99 to 130, a color rendering index (CRI) that is greater than 95 at correlated color temperature (CCT) of 2700-6500K, and R1-R15 that is respectively greater than 90.

2. The white light emitting device of claim 1, wherein the blue-green phosphor comprises Lu$_3$Al$_5$O$_{12}$:Ce, Lu$_3$(Al,Ga)$_5$O$_{12}$:Ce, Y$_3$(Al,Ga)$_5$O$_{12}$:Ce, (Lu,Y)$_3$Al$_5$O$_{12}$:Ce, (Lu,Y)$_3$(Al,Ga)$_5$O$_{12}$:Ce or a combination thereof.

3. The white light emitting device of claim 1, wherein the green phosphor comprises Lu$_3$Al$_5$O$_{12}$:Ce, Lu$_3$(Al,Ga)$_5$O$_{12}$:Ce, Y$_3$(Al,Ga)$_5$O$_{12}$:Ce, (Lu,Y)$_3$Al$_5$O$_{12}$:Ce, (Lu,Y)$_3$(Al,Ga)$_5$O$_{12}$:Ce or a combination thereof.

4. The white light emitting device of claim 1, wherein the green phosphor has a doping concentration of Ce that is greater than a doping concentration of Ce of the blue-green phosphor.

5. The white light emitting device of claim 1, wherein the blue-green phosphor and the green phosphor are represented by A$_3$(Al,Ga)$_5$O$_{12}$:Ce, and the blue-green phosphor has an amount of Ga that is greater than an amount of Ga of the green phosphor.

6. The white light emitting device of claim 1, wherein the blue-green phosphor and the green phosphor are represented by (Lu,Y)$_3$B$_5$O$_{12}$:Ce, and the green phosphor has an amount of Y that is greater than an amount of Y of the blue-green phosphor.

7. The white light emitting device of claim 1, wherein the red phosphor comprises CaAlSiN$_3$:Eu, Sr$_2$Si$_5$N$_8$:Eu, K$_2$SiF$_6$:Mn$^{4+}$, Sr(LiAl$_3$N$_4$):Eu$^{2+}$, or a combination thereof.

8. The white light emitting device of claim 1, wherein a weight ratio of the blue-green phosphor:the green phosphor:the red phosphor=(0.05-1):1:(0.05-0.25).

9. The white light emitting device of claim 8, wherein the white light emitting device is configured to emit a light having a correlated color temperature (CCT) from 2700K to 3500K, and the weight of the red phosphor is substantially equal to or greater than the blue-green phosphor.

10. The white light emitting device of claim 8, wherein the white light emitting device is configured to emit a light having a correlated color temperature (CCT) from 3750K to 4250K, and the weight of the green phosphor is greater than the blue-green phosphor, and the weight of the blue-green phosphor is greater than the red phosphor.

11. The white light emitting device of claim 8, wherein the white light emitting device is configured to emit a light having a correlated color temperature (CCT) from 5000K to 6500K, and the weight of the green phosphor is substantially equal to or greater than the blue-green phosphor, and the weight of the blue-green phosphor is greater than the red phosphor.

12. The white light emitting device of claim 1, wherein a fully enclosed space is defined by the substrate, the reflective wall, and the cover layer, and the blue LED chip and the phosphor layer are disposed in the space.

13. The white light emitting device of claim 1, wherein the blue LED chip has a bottom surface, a top surface, and a side surface between the top and bottom surfaces, and wherein the bottom surface of the blue LED chip is directly contacted to the upper surface of the substrate, and the top surface and the side surface of the blue LED chip are directly contacted to the phosphor layer.

14. The white light emitting device of claim 1, wherein the cover layer is made of glass or silicone.

* * * * *